(12) United States Patent
Heo et al.

(10) Patent No.: US 10,483,337 B2
(45) Date of Patent: Nov. 19, 2019

(54) ORGANIC LIGHT EMITTING DISPLAY DEVICE AND METHOD OF MANUFACTURING THE SAME

(71) Applicant: Samsung Display Co., Ltd., Yongin-si, Gyeonggi-do (KR)

(72) Inventors: Eui Kang Heo, Seoul (KR); Youngdae Kim, Seoul (KR); Jeong-Seon Kim, Hwaseong-si (KR); Cha-Dong Kim, Seoul (KR); Hyunae Kim, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/965,730

(22) Filed: Apr. 27, 2018

(65) Prior Publication Data

US 2019/0115405 A1   Apr. 18, 2019

(30) Foreign Application Priority Data

Oct. 17, 2017 (KR) .................. 10-2017-0134854

(51) Int. Cl.
*H01L 27/32* (2006.01)
*H01L 51/52* (2006.01)

(52) U.S. Cl.
CPC ...... *H01L 27/3248* (2013.01); *H01L 27/3246* (2013.01); *H01L 27/3258* (2013.01); *H01L 27/3276* (2013.01); *H01L 51/5206* (2013.01); *H01L 2227/323* (2013.01)

(58) Field of Classification Search
CPC ............. H01L 27/3246; H01L 27/3248; H01L 27/3258; H01L 2227/323; H01L 27/3276; H01L 51/5206
See application file for complete search history.

(56) References Cited

U.S. PATENT DOCUMENTS

| | | | |
|---|---|---|---|
| 2011/0012816 A1* | 1/2011 | Kang | H01L 27/326 345/76 |
| 2015/0084014 A1* | 3/2015 | Kim | H01L 27/3276 257/40 |
| 2015/0155391 A1* | 6/2015 | Lee | H01L 29/78675 257/66 |

FOREIGN PATENT DOCUMENTS

| | | |
|---|---|---|
| KR | 2001-0050455 A | 6/2001 |
| KR | 10-2012-0072950 A | 7/2012 |
| KR | 10-2012-0078954 A | 7/2012 |
| KR | 10-2016-0055333 A | 5/2016 |
| KR | 10-2016-0074333 A | 6/2016 |

* cited by examiner

*Primary Examiner* — Jasmine J Clark
(74) *Attorney, Agent, or Firm* — Lewis Roca Rothgerber Christie LLP

(57) ABSTRACT

An organic light emitting display device may include a switching element disposed on a substrate, a planarization layer covering the switching element, a first electrode disposed on the planarization layer and coupled to the switching element, a first through hole being defined in a peripheral portion of the first electrode, a pixel defining layer covering the peripheral portion of the first electrode to expose an emission portion of the first electrode, an organic light emitting layer disposed on the emission portion of the first electrode, and a second electrode disposed on the organic light emitting layer.

16 Claims, 16 Drawing Sheets

ORGANIC LIGHT EMITTING DISPLAY DEVICE AND METHOD OF MANUFACTURING THE SAME

CROSS-REFERENCE TO RELATED APPLICATION

This application claims priority to and the benefit of Korean Patent Application No. 10-2017-0134854, filed on Oct. 17, 2017 in the Korean Intellectual Property Office (KIPO), the entire content of which is incorporated herein by reference.

BACKGROUND

1. Field

Embodiments of the present disclosure relate to display devices. For example, embodiments of the present disclosure relate to organic light emitting display devices and methods of manufacturing the organic light emitting display devices.

2. Description of the Related Art

An organic light emitting display device may have an organic light emitting element including a hole injection layer, an electron injection layer, and an organic light emitting layer formed therebetween. In the organic light emitting display device, light may be generated as excitons, which are the combination of holes injected from the hole injection layer and electrons injected from the electron injection layer, fall (e.g., relax or transition) from an excited state to a ground state. The organic light emitting display device may not include a separate light source to generate light, and thus the organic light emitting display device may have a relatively small thickness and light weight as well as relatively low power consumption. Furthermore, the organic light emitting display device may have a relatively wide viewing angle, high contrast and high response speed, etc.

The organic light emitting display device may include a planarization layer and a pixel defining layer. The planarization layer may protect a switching element for driving the organic light emitting element and planarize an upper portion of the switching element. The pixel defining layer may separate pixels on the planarization layer. The planarization layer and the pixel defining layer may include an organic material.

SUMMARY

Embodiments of the present disclosure provide an organic light emitting display device including an outgassing hole that substantially prevents or decreases a damage of the organic light emitting display device according to an outgas from an organic insulation layer.

Embodiments of the present disclosure provide a method of manufacturing an organic light emitting display device including forming an outgassing hole that substantially prevents or decreases a damage of the organic light emitting display device according to an outgas from an organic insulation layer.

An organic light emitting display device according to an embodiment may include a switching element disposed on a substrate, a planarization layer covering the switching element, a first electrode disposed on the planarization layer and coupled to (e.g., connected to) the switching element, a first through hole being defined in a peripheral portion of the first electrode, a pixel defining layer covering the peripheral portion of the first electrode to expose an emission portion of the first electrode, an organic light emitting layer disposed on the emission portion of the first electrode, and a second electrode disposed on the organic light emitting layer.

In an embodiment, the organic light emitting display device may further include a plurality of first through holes.

In an embodiment, the plurality of first through holes may be disposed along the peripheral portion of the first electrode to surround the emission portion of the first electrode.

In an embodiment, the first through hole may have a circular shape in a plan view.

In an embodiment, a diameter of the first through hole may be less than a width of the peripheral portion of the first electrode.

In an embodiment, the organic light emitting display device may further include a wiring disposed on the planarization layer and spaced apart from the first electrode, a second through hole being defined in the wiring.

In an embodiment, the second through hole may have a circular shape in a plan view.

In an embodiment, a diameter of the second through hole may be less than a width of the wiring.

In an embodiment, the wiring may transmit a driving voltage to the switching element.

In an embodiment, the planarization layer may include a siloxane-based organic material.

In order to achieve the object of the present disclosure described above, an organic light emitting display device according to an embodiment may include a switching element disposed on a substrate, a planarization layer covering the switching element, a first electrode disposed on the planarization layer and couple to (e.g., connected to) the switching element, a wiring disposed on the planarization layer and spaced apart from the first electrode, a through hole being defined in the wiring, a pixel defining layer covering the peripheral portion of the first electrode to expose an emission portion of the first electrode and covering the wiring, an organic light emitting layer disposed on the emission portion of the first electrode, and a second electrode disposed on the organic light emitting layer.

In an embodiment, the organic light emitting display device may further include a plurality of through holes.

In an embodiment, the plurality of through holes may be disposed along a direction in which the wiring is extended.

In an embodiment, the through hole may have a circular shape in a plan view.

In an embodiment, a diameter of the through hole may be less than a width of the wiring.

In an embodiment, the wiring may transmit a driving voltage to the switching element.

In order to achieve the object of the present disclosure described above, a method of manufacturing an organic light emitting display device according to an embodiment may include forming a switching element on a substrate, forming a planarization layer covering the switching element, forming a first electrode coupled to (e.g., connected to) the switching element on the planarization layer, a first through hole being defined in a peripheral portion of the first electrode, forming a pixel defining layer covering the peripheral portion of the first electrode to expose an emission portion of the first electrode, forming an organic light emitting layer on the emission portion of the first electrode, and forming a second electrode on the organic light emitting layer.

In an embodiment, forming the first electrode may include forming a conductive layer coupled to (e.g., connected to) the switching element on the planarization layer and etching the conductive layer to concurrently (e.g., simultaneously) form the first electrode and the first through hole.

In an embodiment, the method may further include forming a wiring spaced apart from the first electrode on the planarization layer, a second through hole being defined in the wiring.

In an embodiment, forming the first electrode and the wiring may include forming a conductive layer coupled to (e.g., connected to) the switching element on the planarization layer and etching the conductive layer to concurrently (e.g., simultaneously) form the first electrode, the wiring, the first through hole, and the second through hole.

In the organic light emitting display device according to embodiments of the present disclosure, the through hole may be defined in the peripheral portion of the first electrode which overlaps the pixel defining layer on the planarization layer. Accordingly, outgas generated from the planarization layer and/or the pixel defining layer may be discharged.

In the organic light emitting display device according to the embodiments, the through hole may be defined in the wiring that is spaced apart from the first electrode on the planarization layer. Accordingly, outgas generated from the planarization layer and/or the pixel defining layer may be discharged.

In the method of manufacturing the organic light emitting display device according to the embodiments, the first electrode and the through hole may be concurrently (e.g., simultaneously) formed. Accordingly, an additional process for forming the through hole may not be necessary.

BRIEF DESCRIPTION OF THE DRAWINGS

Illustrative, non-limiting embodiments will be more clearly understood from the following detailed description taken in conjunction with the accompanying drawings.

DETAILED DESCRIPTION

Hereinafter, organic light emitting display devices and methods of manufacturing the organic light emitting display devices in accordance with embodiments of the present disclosure will be explained in more detail with reference to the accompanying drawings.

Figure 1:
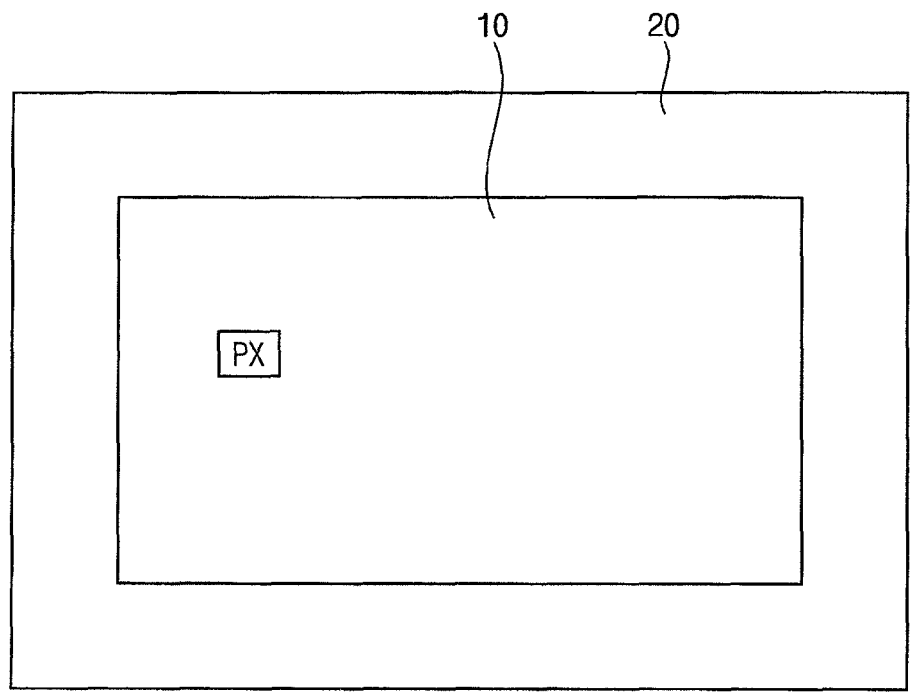
FIG. 1 is a plan view illustrating an organic light emitting display device according to an embodiment.

FIG. 1 is a plan view illustrating an organic light emitting display device according to an embodiment.

Referring to FIG. 1, an organic light emitting display device according to an embodiment may include a display region 10 and a peripheral region 20. A plurality of pixels PX may be disposed in the display region 10. For example, the pixels PX may be substantially arranged in a matrix form. The display region 10 may display an image for which lights emitted by each of the pixels PX are combined.

The peripheral region 20 may be adjacent to the display region 10. The peripheral region 20 may be located at at least one side of the display region 10. For example, the peripheral region 20 may surround the display region 10 as illustrated in FIG. 1.

Hereinafter, an organic light emitting display device according to an embodiment will be explained with reference to FIGS. 2 and 3.

Figure 2:
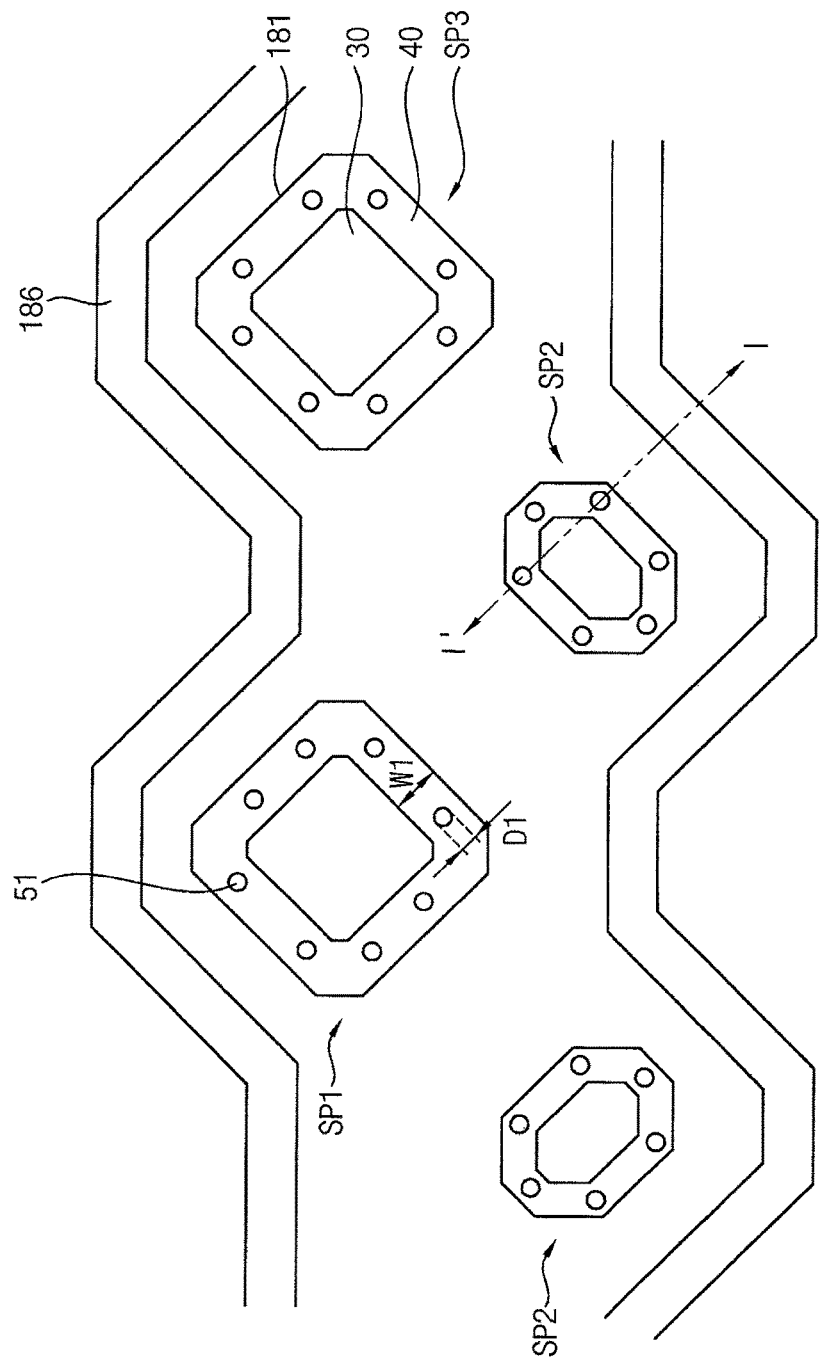
FIG. 2 is a plan view illustrating a display region of an organic light emitting display device according to an embodiment.

FIG. 2 is a plan view illustrating a display region of an organic light emitting display device according to an embodiment. FIG. 3 is a cross-sectional view illustrating the organic light emitting display device in FIG. 2 cut along a line I-I'.

Figure 3:
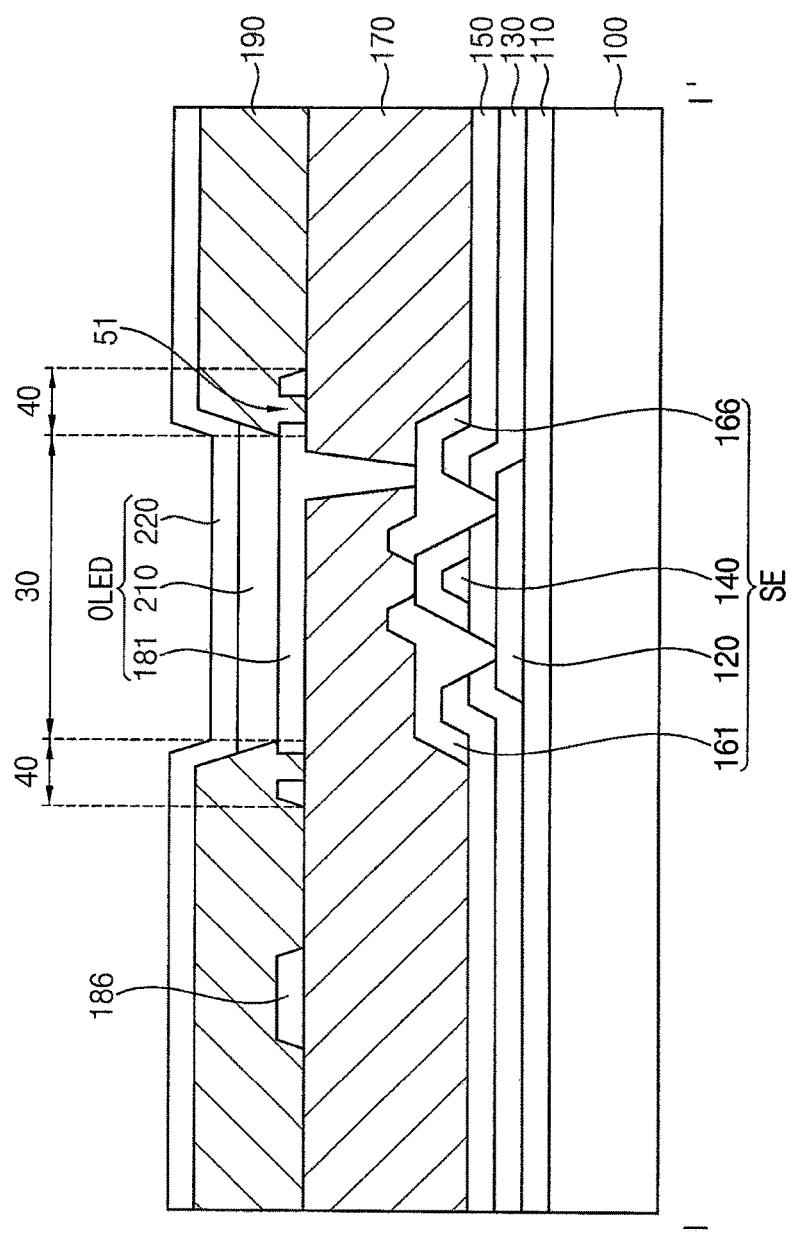
FIG. 3 is a cross-sectional view illustrating the organic light emitting display device in FIG. 2 cut along a line I-I'.

Referring to FIGS. 2 and 3, an organic light emitting display device according to an embodiment may include a switching element SE, a planarization layer 170, a wiring 186, a pixel defining layer 190, and an organic light emitting diode OLED including a first electrode 181, an organic light emitting layer 210, and a second electrode 220.

Referring to FIG. 2, each pixel PX may include a plurality of sub-pixels. In an embodiment, each pixel PX may include a first sub-pixel SP1, a second sub-pixel SP2, and a third sub-pixel SP3. For example, the first sub-pixel SP1 may be a red sub-pixel emitting a red light, the second sub-pixel SP2 may be a green sub-pixel emitting a green light, and the third sub-pixel SP3 may be a blue sub-pixel emitting a blue light. In an embodiment, each pixel PX may include one first sub-pixel SP1, two second sub-pixels SP2, and one third sub-pixel PX3. However, the present disclosure is not limited thereto, and each pixel PX may include a plurality of sub-pixels emitting different colors from each other.

Referring to FIG. 3, a buffer layer 110 may be disposed on a substrate 100. The substrate may include an insulating material such as glass, plastic, or the like. The buffer layer 110 may block impurities flowed in through the substrate 100.

The switching element SE may be disposed on the buffer layer 110. The switching element SE may supply a driving current to the organic light emitting diode OLED based on an external signal. In an embodiment, the switching element SE may include a thin film transistor. For example, the switching element SE may include an active pattern 120, a gate electrode 140, a source electrode 161, and a drain electrode 166.

The active pattern 120 may be disposed on the buffer layer 110. The active pattern 120 may include amorphous silicon, polycrystalline silicon, an oxide semiconductor, or the like.

A gate insulation layer 130 covering the active pattern 120 may be disposed on the buffer layer 110. The gate insulation layer 130 may insulate the gate electrode 140 from the active pattern 120. The gate insulation layer 130 may include an inorganic material such as silicon oxide and silicon nitride, or an organic material.

A gate electrode 140 may be disposed on the gate insulation layer 130. The gate electrode 140 may overlap the active patter 120. The gate electrode 140 may include a conductive material such as metal.

An insulation interlayer 150 covering the gate electrode 140 may be disposed on the gate insulation layer 130. The insulation interlayer 150 may insulate the source electrode 161 and the drain electrode 166 from the gate electrode 140. The insulation interlayer 150 may include an inorganic material such as silicon oxide and silicon nitride, or an organic material.

The source electrode 161 and the drain electrode 166 may be disposed on the insulation interlayer 150. The source electrode 161 and the drain electrode 166 may respectively contact the active pattern 120 through contact holes formed in the gate insulation layer 130 and the insulation interlayer 150. The source electrode 161 and the drain electrode 166 may include a conductive material such as metal.

The planarization layer 170 covering the switching element SE may be disposed on the insulation interlayer 150. The planarization layer 170 may alleviate a step portion according to the switching element SE so as to provide a flat surface to the organic light emitting diode OLED.

The planarization layer 170 may include an organic material. In an embodiment, the planarization layer 170 may include a siloxane-based organic material.

The organic light emitting diode OLED may be disposed on the planarization layer 170. The organic light emitting diode OLED may be electrically coupled to (e.g., electrically connected to) the switching element SE. The organic light emitting diode OLED may emit light based on the driving current supplied from the switching element SE. In an embodiment, the organic light emitting diode OLED may include the first electrode 181, an organic light emitting layer 210, and a second electrode 220.

The first electrode 181 may be disposed on the planarization layer 170. The first electrode 181 may be electrically coupled to (e.g., electrically connected to) the drain electrode 166 of the switching element SE. For example, the first electrode 181 may contact the drain electrode 166 through a contact hole formed in the planarization layer 170.

The first electrode 181 may be a reflective electrode including a reflective layer. In an embodiment, the reflective layer may include metal, and a transparent or transflective electrode layer including a conductive oxide material may be disposed on the reflective layer. For example, the first electrode 181 may be composed of three layers of indium tin oxide (ITO)/silver (Ag)/indium tin oxide (ITO).

The first electrode 181 may have an island shape per each of the sub-pixels SP1, SP2, and SP3. The first electrode 181 may include an emission portion 30 and a peripheral portion 40. The emission portion 30 may be located at a center of the first electrode 181, and the peripheral portion 40 may surround the emission portion 30. The emission portion 30 may be an emission region on which the organic light emitting layer 210 is disposed, and the peripheral portion 40 may be a non-emission region covered by the pixel defining layer 190.

The wiring 186 may be disposed on the planarization layer 170. The wiring 186 may be spaced apart from the first electrode 181. In an embodiment, the wiring 186 may be a power wiring transmitting a driving voltage to the switching element SE.

The pixel defining layer 190 covering the first electrode 181 and the wiring 186 may be disposed on the planarization layer 170. The pixel defining layer 190 may partially cover the first electrode 181. For example, the pixel defining layer 190 may cover the peripheral portion 40 of the first electrode 181, and may not cover the emission portion 30 of the first electrode 181. The organic light emitting layer 210 may be disposed on the emission portion 30 of the first electrode 181 which is exposed by the pixel defining layer 190. Therefore, light may be emitted from the emission portion 30 and may not be emitted from the peripheral portion 40.

The pixel defining layer 190 may include an organic material. In an embodiment, the pixel defining layer 190 may include a siloxane-based organic material.

A gas may be generated from the planarization layer 170 and the pixel defining layer 190 including the organic material according to short-term or long term chemical dissolution of moisture or the like. When the gas is not properly discharged, the organic light emitting diode OLED may be degraded, and pixel shrinkage, lifespan decreasing, or the like may be induced.

In another organic light emitting display device, an opening and/or a discharging hole is formed at the planarization layer 170 and/or the pixel defining layer 190 in the peripheral region 20 to discharge the gas, however, it may not be enough to discharge a sufficient amount of gas. For example, when the planarization layer 170 and/or the pixel defining layer 190 include the siloxane-based organic material, a relatively great amount of gas may be generated, so that it is limited to discharge sufficient amount of gas.

A through hole 51 may be defined in the peripheral portion 40 of the first electrode 181. The through hole 51 may pass through the first electrode 181 in a thickness direction, and may expose an upper portion of the planarization layer 170.

A gas generated from the planarization layer 170 and/or the pixel defining layer 190 may be discharged via the through hole 51. For example, since the through hole 51 is defined in the first electrode 181 inside the display region 10, a gas generated from the planarization layer 170 and/or the pixel defining layer 190 inside the display region 10 may be discharged.

The pixel defining layer 190 may cover the peripheral portion 40 of the first electrode 181, and the through hole 51 may be defined in the peripheral portion 40 of the first electrode 181 which overlaps the pixel defining layer 190. Accordingly, although the through hole 51 for discharging a gas is formed in the first electrode 181, the emission portion 30 from which light is emitted may not be influenced by the through hole 51.

In an embodiment, the number of the through hole 51 may be plural. In other words, the first electrode 181 may include a plurality of through holes 51. For example, the first electrode 181 of the first sub-pixel SP1 and the first electrode 181 of the third sub-pixel SP3 may include eight through holes 51, respectively, and the first electrode 181 of the second sub-pixel SP2 may include six through holes 51. However, the number of the through holes 51 is not limited thereto, and the first electrode 181 may include various suitable numbers of the through holes 51.

In an embodiment, the through holes 51 may be disposed along the peripheral portion 40 of the first electrode 181 to surround the emission portion 30 of the first electrode 181. For example, the through holes 51 may be distributed in the peripheral portion 40 of the first electrode 181 that surround the emission portion 30.

In an embodiment, the through hole 51 may have a circular shape in a plan view. A diameter D1 of the through hole 51 may be less than a width W1 of the peripheral portion 40 of the first electrode 181. The width W1 of the peripheral portion 40 of the first electrode 181 may be defined as a direction perpendicular to (e.g., substantially perpendicular to) a direction in which the peripheral portion 40 is extended. For example, the diameter D1 of the through hole 51 may be from about 2 μm to about 3 μm, and the width W1 of the peripheral portion 40 of the first electrode 181 may be from about 5 μm to about 6 μm. Accordingly, the through hole 51 may be located inside the peripheral portion 40 of the first electrode 181. In other words, the through hole 51 may not be disposed inside the emission portion 30.

The organic light emitting layer 210 may be disposed on the emission portion 30 of the first electrode 181. In an embodiment, the organic light emitting diode OLED may emit a red light, a green light, or a blue light according to a type (or kind) of the organic light emitting layer 210. For example, the organic light emitting layer 210 of the first sub-pixel SP1 may emit the red light, the organic light emitting layer 210 of the second sub-pixel SP2 may emit the green light, and the organic light emitting layer 210 of the third sub-pixel SP3 may emit the blue light.

In an embodiment, the organic light emitting diode OLED may further include a hole injection layer and/or a hole transport layer disposed between the first electrode 181 and the organic light emitting layer 210, and an electron transport layer and/or an electron injection layer disposed between the organic light emitting layer 210 and the second electrode 220.

The second electrode 220 may be disposed on the organic light emitting layer 210. The second electrode 220 may be commonly disposed for the sub-pixels SP1, SP2, and SP3 (e.g., the second electrode 220 may be a common electrode). Accordingly, the second electrode 220 may be disposed on the organic light emitting layer 210 and the pixel defining layer 190.

The second electrode may include various suitable conductive materials, and may be provided as a transparent electrode or a transflective electrode. The second electrode 220 may transmit light by forming the conductive material into a thin film having a thickness of several to several tens of nanometers. In this case, the organic light emitting display device may be a top emission type (or kind) of device in which light is emitted in a direction from the organic light emitting layer 210 to the second electrode 220.

A thin film encapsulation layer may be disposed on the second electrode 220. The thin film encapsulation layer may prevent oxygen and/or moisture from being flowed in the organic light emitting diode OLED (or may reduce such flow of oxygen and/or moisture). The thin film encapsulation layer may include at least one organic layer and at least one inorganic layer.

The organic light emitting display device according to an embodiment with reference to FIGS. 2 and 3 may include the through hole 51 defined in the first electrode 181. Accordingly, a gas generated from the planarization layer 170 and/or the pixel defining layer 190 inside the display region 10 may be discharged enough.

Hereinafter, a method of manufacturing an organic light emitting display device in FIG. 3 according to an embodiment will be explained with reference to FIGS. 4, 5, 6, 7, 8, 9, and 10.

FIGS. 4, 5, 6, 7, 8, 9, and 10 are cross-sectional views illustrating a method of manufacturing an organic light emitting display device according to an embodiment.

Figure 4:
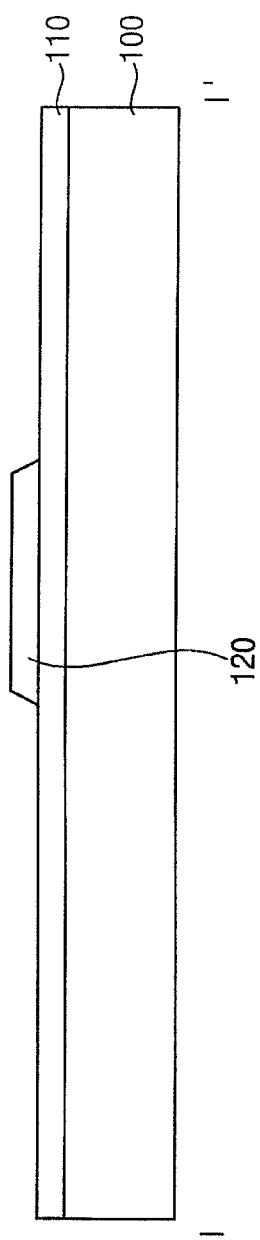
FIGS. 4, 5, 6, 7, 8, 9, and 10 are cross-sectional views illustrating a method of manufacturing an organic light emitting display device according to an embodiment.
Figure 5:
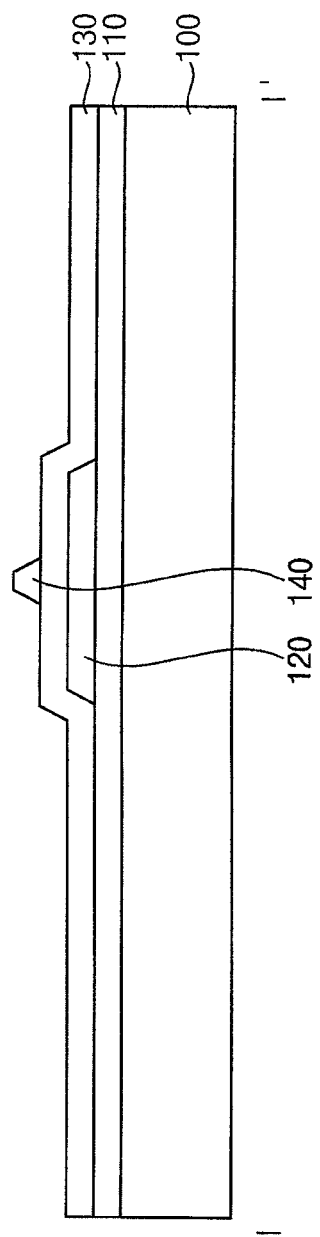
Figure 6:
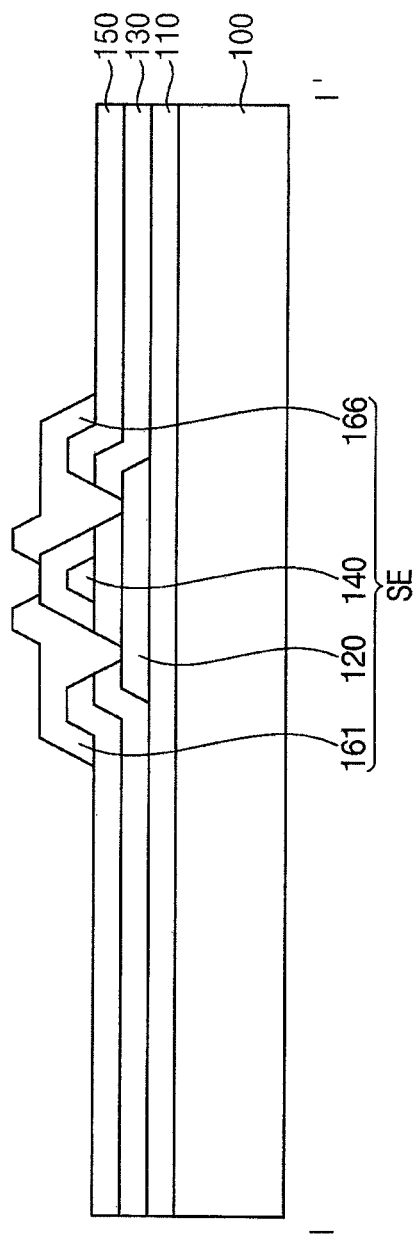

Referring to FIGS. 4, 5, and 6, the switching element SE may be formed on the substrate 100.

Referring to FIG. 4, the buffer layer 110 may be formed on the substrate 100, and the active pattern 120 may be formed on the buffer layer 110. For example, a semiconductor layer may be formed by a chemical vapor deposition (CVD) method, a sputtering method, or the like on the buffer layer 110, and then the semiconductor layer may be etched so as to form the active pattern 120.

Referring to FIG. 5, the gate insulation layer 130 covering the active pattern 120 may be formed on the buffer layer 110, and the gate electrode 140 may be formed on the gate insulation layer 130. For example, a first conductive layer may be formed by a chemical vapor deposition method, a sputtering method, or the like on the gate insulation layer 130, and then the first conductive layer may be etched so as to form the gate electrode 140. Further, impurities may be injected to opposing ends of the active pattern 120 by using the gate electrode 140 as a mask.

Referring to FIG. 6, the insulation interlayer 150 covering the gate electrode 140 may be formed on the gate insulation layer 130, and the source electrode 161 and the drain electrode 166 may be formed on the insulation interlayer 150. For example, contact holes each exposing the opposing ends of the active pattern 120 may be formed in the insulation interlayer 150 and the gate insulation layer 130. Then, a second conductive layer filling the contact holes may be formed by a chemical vapor deposition method, a sputtering method, or the like on the insulation interlayer 150, and then the second conductive layer may be etched so as to form the source electrode 161 and the drain electrode 166.

Figure 7:
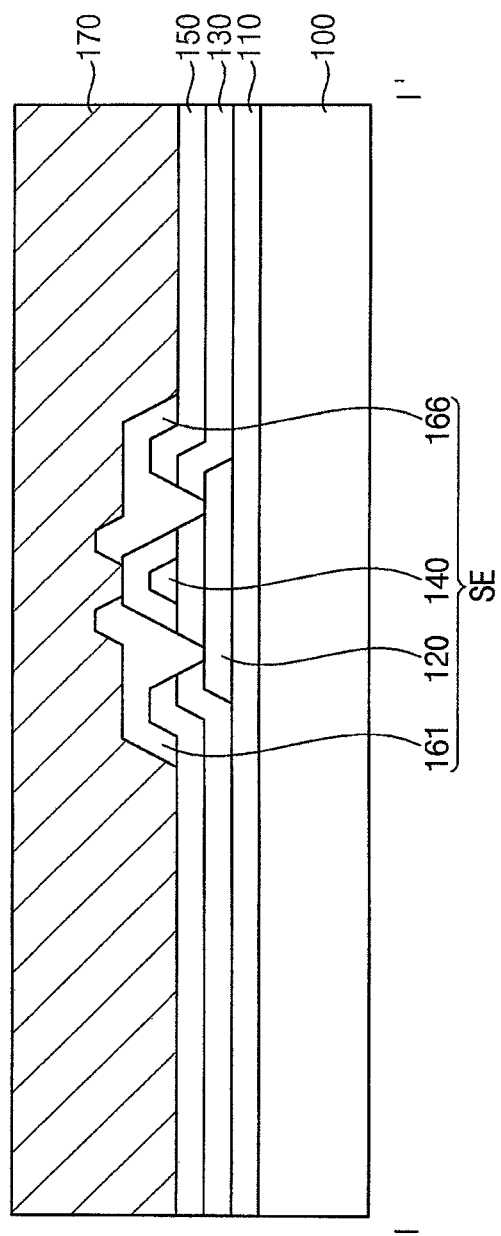

Referring to FIG. 7, the planarization layer 170 covering the switching element SE may be formed on the insulation interlayer 150. For example, the planarization layer 170 may be formed of a siloxane-based organic material on the insulation interlayer 150. The planarization layer 170 may be formed to have a flat upper portion.

Figure 8:
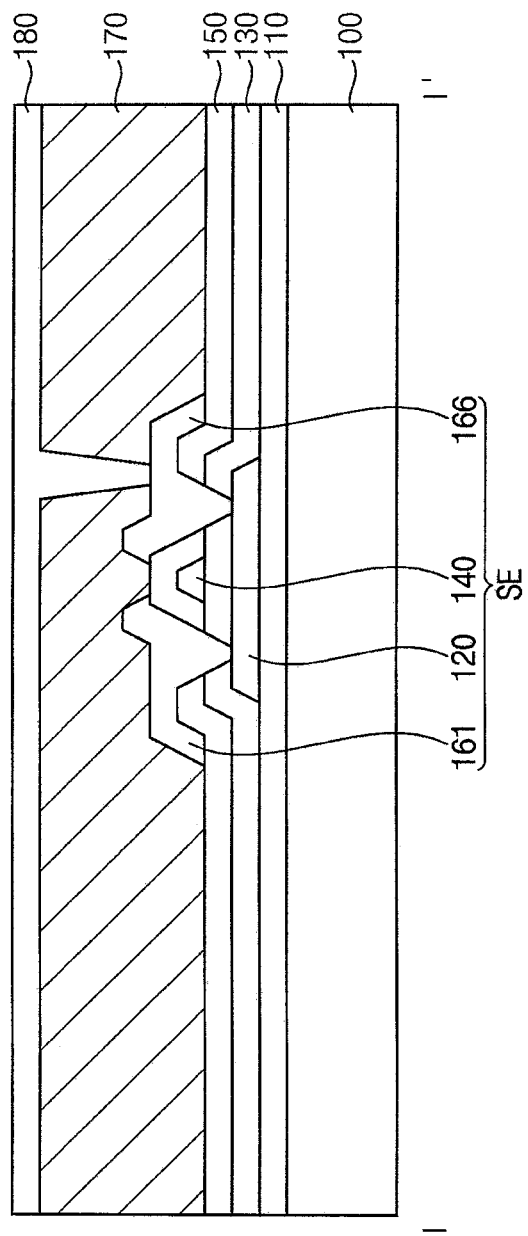

Referring to FIG. 8, a third conductive layer 180 coupled to (e.g., connected to) the switching element SE may be formed on the planarization layer 170. For example, a contact hole exposing the drain electrode 166 may be formed in the planarization layer 170, and the third conductive layer 180 filling the contact hole may be formed by a chemical vapor deposition method, a sputtering method, or the like on the planarization layer 170.

Figure 9:
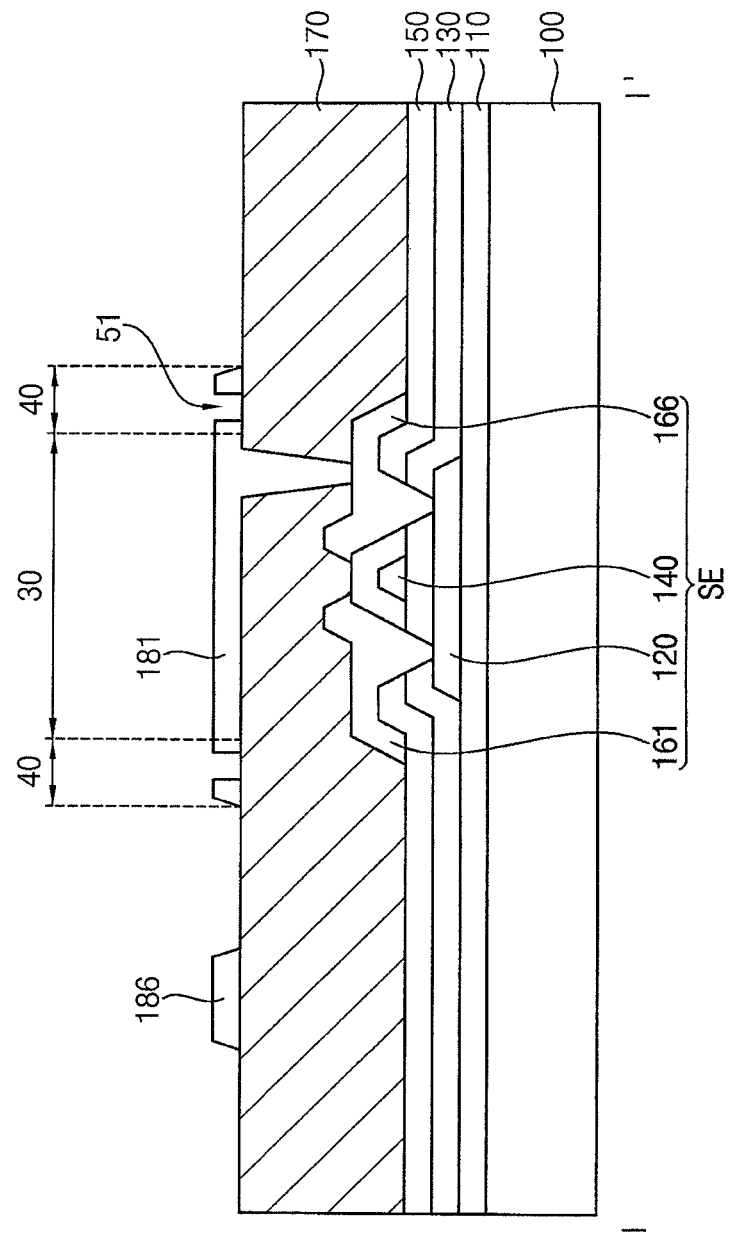

Referring to FIG. 9, the third conductive layer 180 may be etched to form the first electrode 181 and the wiring 186.

In an embodiment, the third conductive layer 180 may be etched to substantially concurrently (e.g., simultaneously) form the first electrode 181 and the wiring 186. Accordingly, an additional etching process for forming the wiring 186 may not be necessary.

The through hole 51 exposing the planarization layer 170 may be formed in the peripheral portion 40 of the first electrode 181. In an embodiment, the through hole 51 may be substantially concurrently (e.g., simultaneously) formed with the first electrode 181 and the wiring 186. For example, the third conductive layer 180 may be etched to substantially concurrently (e.g., simultaneously) form the first electrode 181, the wiring 186, and the through hole 51. Accordingly, an additional etching process for forming the through hole 51 may not be necessary.

In an embodiment, the third conductive layer 180 may be etched by a wet etching process. In this case, the through hole 51 may have a circular shape in a plan view.

Figure 10:
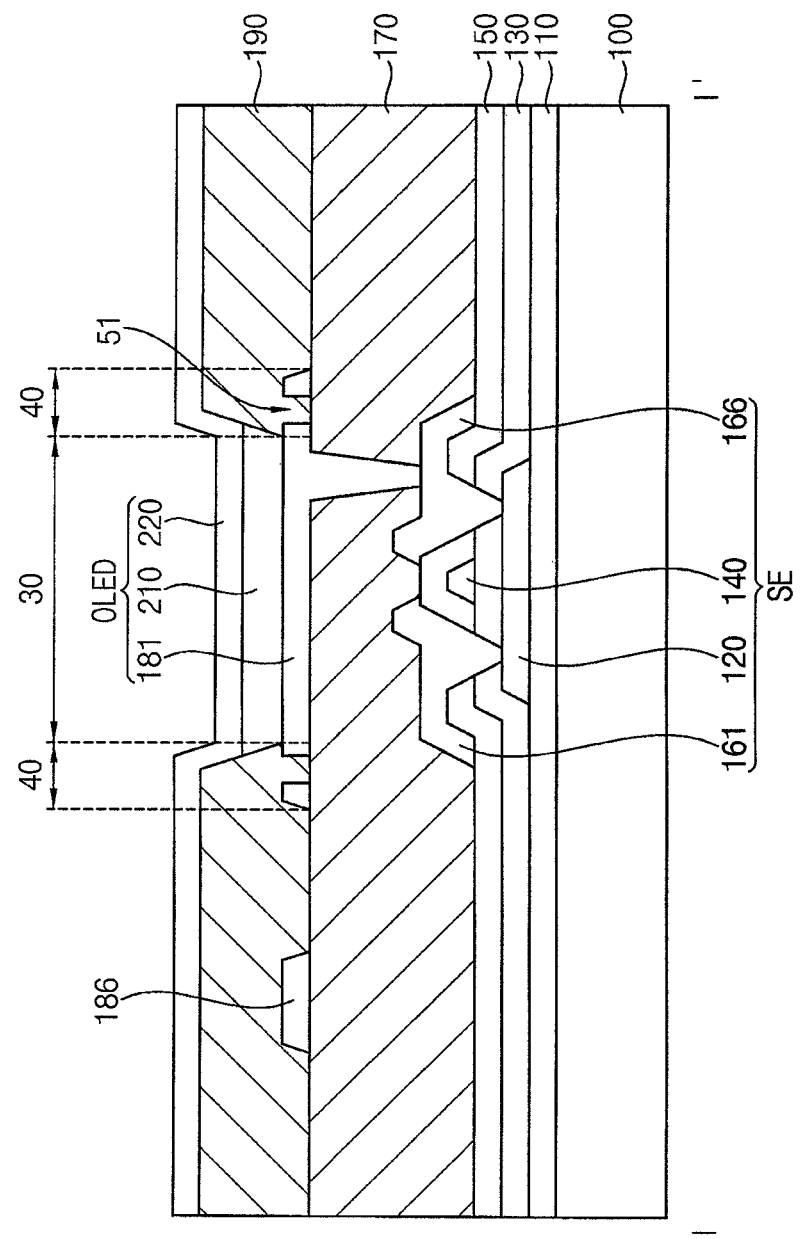

Referring to FIG. 10, the pixel defining layer 190, the organic light emitting layer 210, and the second electrode 220 may be formed on the planarization layer 170.

The pixel defining layer 190 covering the first electrode 181 and the wiring 186 may be formed on the planarization layer 170. For example, the pixel defining layer 190 may be formed of a siloxane-based organic material on the planarization layer 170. The pixel defining layer 190 may be formed to cover the peripheral portion 40 of the first electrode 181 and expose the emission portion 30 of the first electrode 181.

The organic light emitting layer 210 and the second electrode 220 may be sequentially formed on the first electrode 181 and the pixel defining layer 190. For example, the organic light emitting layer 210 may be formed by a printing method, a mask deposition method, or the like on the emission portion 30 of the first electrode 181, and then the second electrode 220 may be formed on the organic light emitting layer 210 and the pixel defining layer 190. Further, the thin film encapsulation layer including at least one organic layer and at least one inorganic layer may be formed on the second electrode 220.

Hereinafter, an organic light emitting display device according to an embodiment will be explained with reference to FIGS. 11 and 12.

Figure 11:
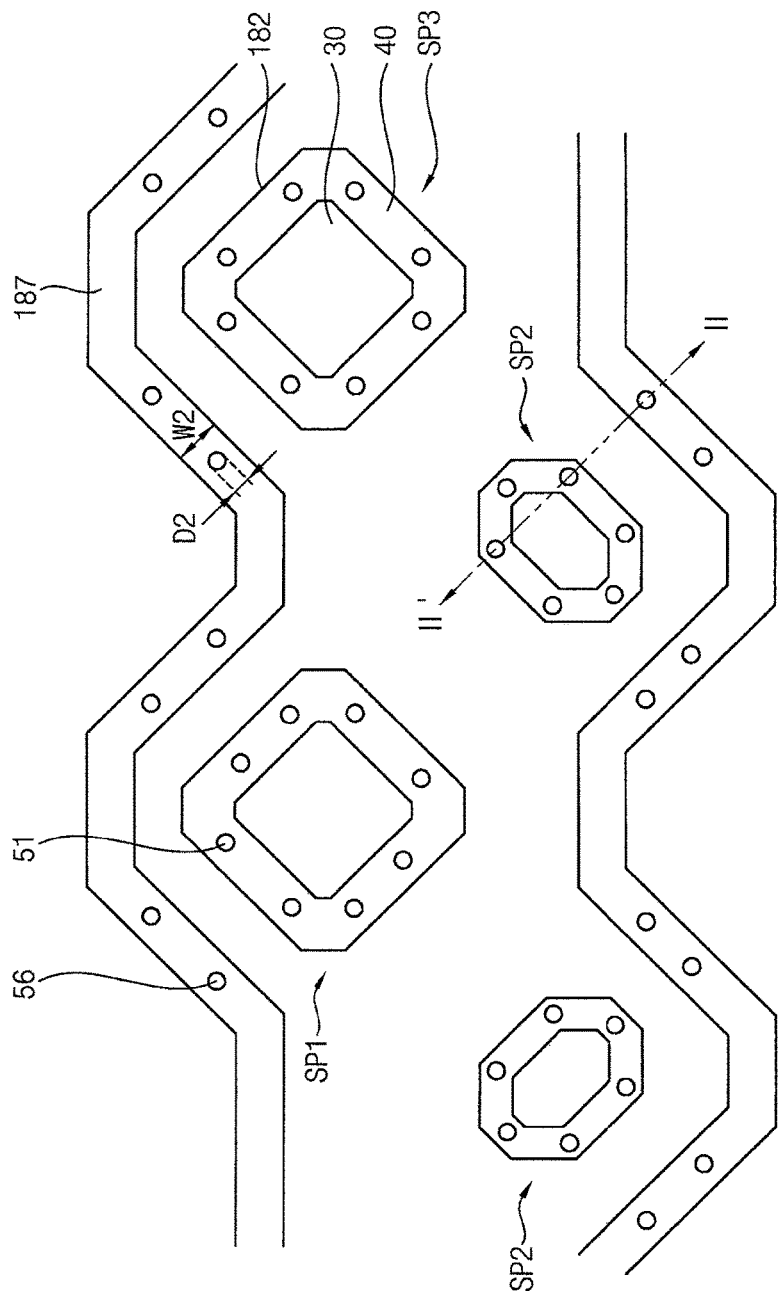
FIG. 11 is a plan view illustrating a display region of an organic light emitting display device according to an embodiment.

FIG. 11 is a plan view illustrating a display region of an organic light emitting display device according to an embodiment. FIG. 12 is a cross-sectional view illustrating the organic light emitting display device in FIG. 11 cut along a line II-II'.

Figure 12:
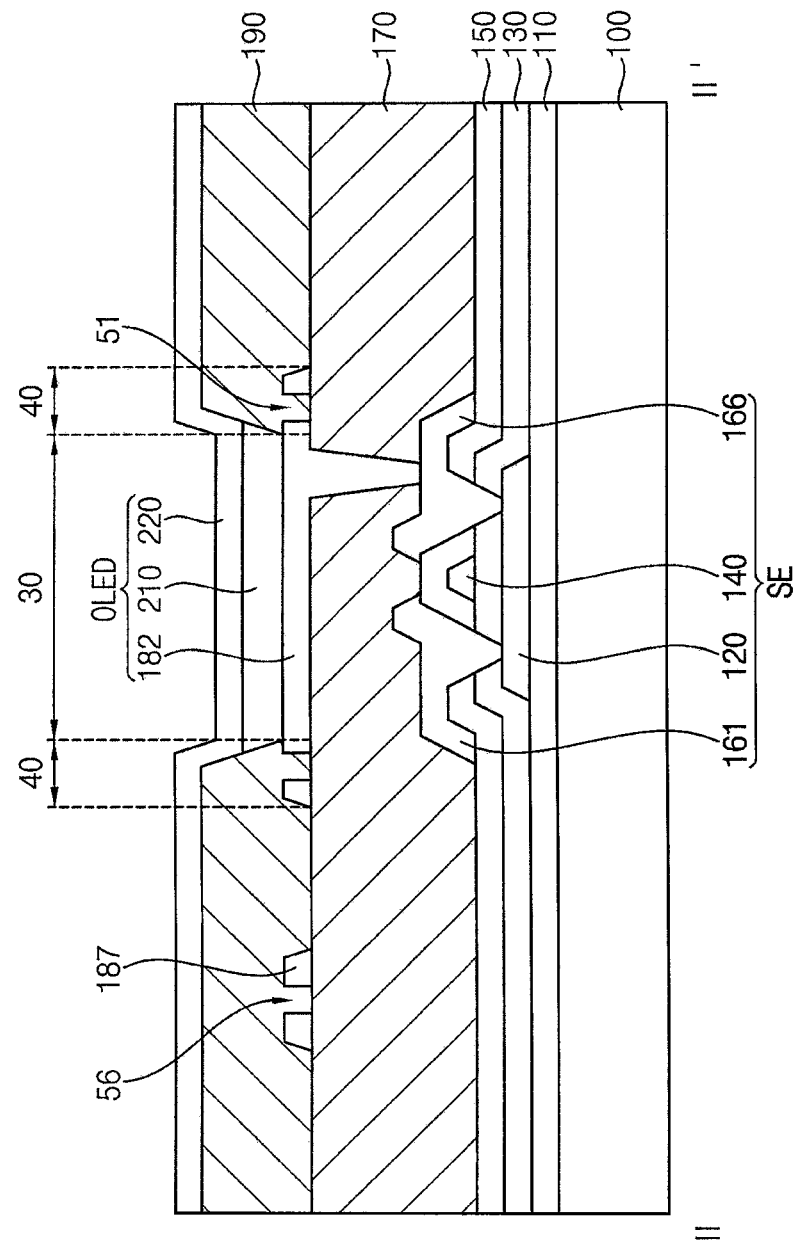
FIG. 12 is a cross-sectional view illustrating the organic light emitting display device in FIG. 11 cut along a line II-II'.

Referring to FIGS. 11 and 12, an organic light emitting display device according to an embodiment may include a switching element SE, a planarization layer 170, an organic light emitting diode OLED including a first electrode 182, a wiring 187, and a pixel defining layer 190. Detailed descriptions of elements of an organic light emitting display device explained with reference to FIGS. 11 and 12, which are substantially the same as or similar to those of the organic light emitting display device explained with reference to FIGS. 2 and 3, may not be repeated here.

The first electrode 182 may be disposed on the planarization layer 170. The first electrode 182 may include an emission portion 30 and a peripheral portion 40.

A first through hole 51 may be defined in the peripheral portion 40 of the first electrode 181. The first through hole 51 may pass through the first electrode 181 in a thickness direction, and may expose an upper portion of the planarization layer 170.

The wiring 187 may be disposed on the planarization layer 170. The wiring 186 may be spaced apart from the first electrode 182. In an embodiment, the wiring 186 may be a power wiring transmitting a driving voltage to the switching element SE.

A second through hole 56 may be defined in the wiring 187. The second through hole 56 may pass through the wiring 187 in a thickness direction, and may expose an upper portion of the planarization layer 170.

A gas generated from the planarization layer 170 and/or the pixel defining layer 190 may be discharged via the second through hole 56. For example, since the second through hole 56 is defined in the wiring 187 inside the display region 10, a gas generated from the planarization layer 170 and/or the pixel defining layer 190 inside the display region 10 may be discharged.

In an embodiment, the number of the second through hole 56 may be plural. In other words, the wiring 187 may include a plurality of second through holes 56.

In an embodiment, the second through holes 56 may be disposed along a direction in which the wiring 187 is extended. For example, the second through holes 56 may be disposed along the wiring 187 that extends and is bent according to shapes of the sub-pixels SP1, SP2, and SP3 as illustrated in FIG. 11.

In an embodiment, the second through hole 56 may have a circular shape in a plan view. A diameter D2 of the second through hole 56 may be less than a width W2 of the wiring 187. The width W2 of the wiring 187 may be defined as a direction perpendicular to (e.g., substantially perpendicular to) a direction in which the wiring 187 is extended. For example, the diameter D2 of the second through hole 56 may be from about 2 μm to about 3 μm, and the width W2 of the wiring 187 may be from about 5 μm to about 10 μm. Accordingly, the second through hole 56 may be located inside the wiring 187.

The pixel defining layer 190 covering the first electrode 182 and the wiring 187 may be disposed on the planarization layer 170. The pixel defining layer 190 may entirely cover the wiring 187.

In comparison with the organic light emitting display device according to an embodiment described with reference to FIGS. 2 and 3, the organic light emitting display device according to an embodiment described with reference to FIGS. 11 and 12 may further include the second through hole 56 defined in the wiring 187 in addition to the first through hole 51 defined in the first electrode 182. Accordingly, a gas generated from the planarization layer 170 and/or the pixel defining layer 190 inside the display region 10 may be discharged more enough.

Hereinafter, a method of manufacturing an organic light emitting display device in FIG. 12 according to an embodiment will be explained with reference to FIGS. 13 and 14.

Figure 13:
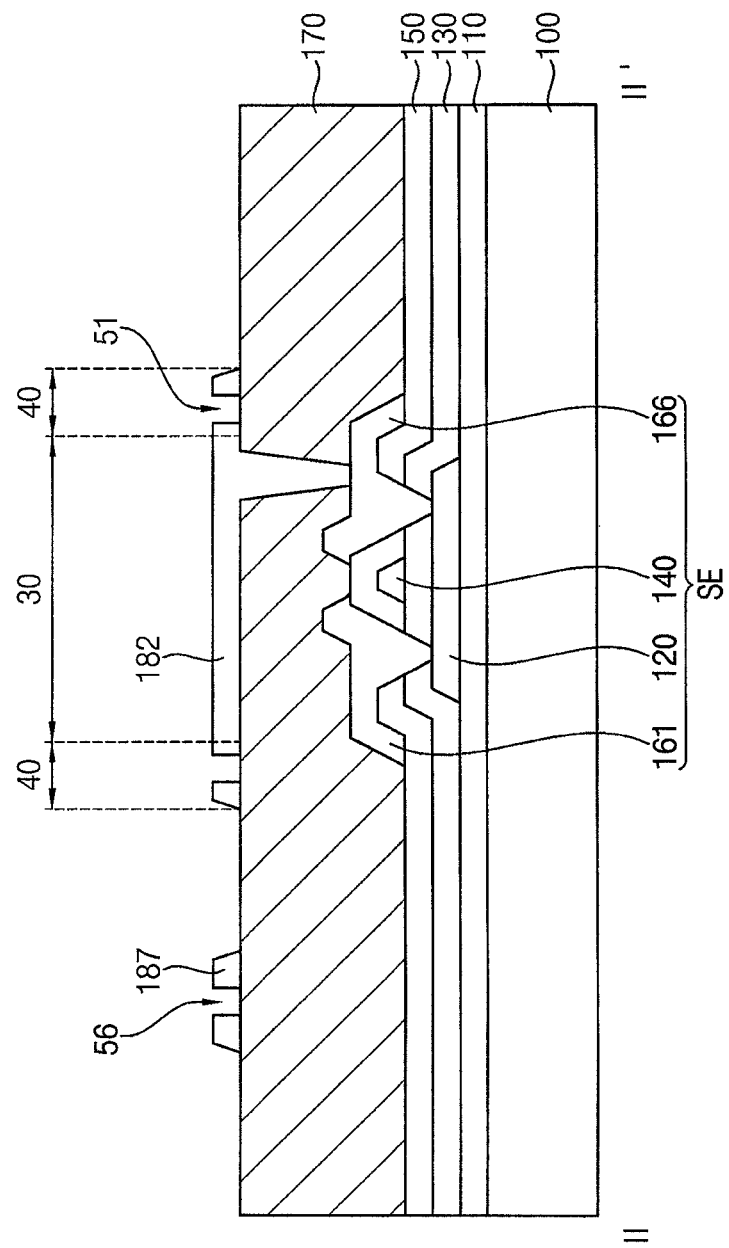
FIGS. 13 and 14 are cross-sectional views illustrating a method of manufacturing an organic light emitting display device according to an embodiment.
Figure 14:
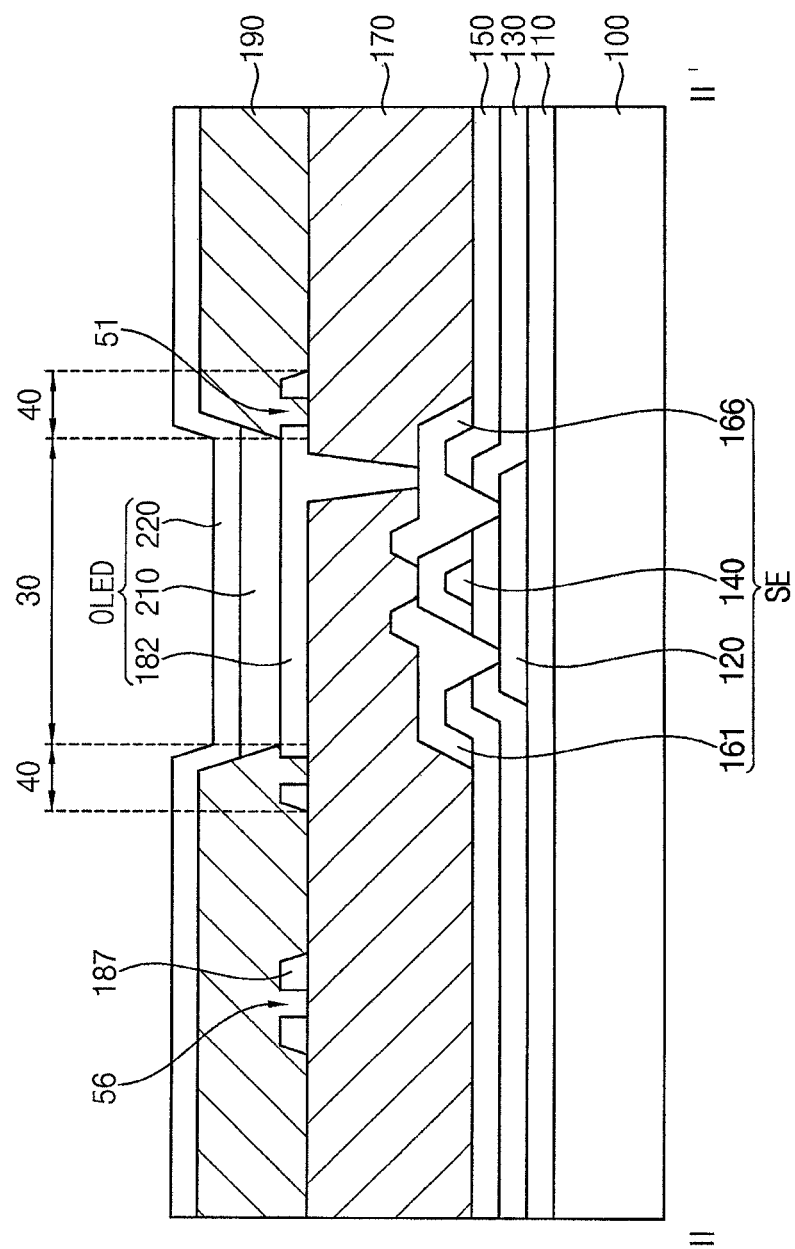

FIGS. 13 and 14 are cross-sectional views illustrating a method of manufacturing an organic light emitting display device according to an embodiment.

Detailed descriptions of elements of a method of manufacturing an organic light emitting display device explained with reference to FIGS. 13 and 14, which are substantially the same as or similar to those of the method of manufacturing the organic light emitting display device explained with reference to FIGS. 4, 5, 6, 7, 8, 9, and 10, may not be repeated here.

Referring to FIG. 13, the third conductive layer 180 may be etched to form the first electrode 182 and the wiring 187.

In an embodiment, the third conductive layer 180 may be etched to substantially concurrently (e.g., simultaneously) form the first electrode 182 and the wiring 187. Accordingly, an additional etching process for forming the wiring 187 may not be necessary.

The first through hole 51 and the second through hole 56 which expose the planarization layer 170 may be formed in the peripheral portion 40 of the first electrode 182 and the wiring 187, respectively. In an embodiment, the first through hole 51 and the second through hole 56 may be substantially concurrently (e.g., simultaneously) formed with the first electrode 182 and the wiring 187. For example, the third conductive layer 180 may be etched to substantially concurrently (e.g., simultaneously) form the first electrode 182, the wiring 187, the first through hole 51, and the second through hole 56. Accordingly, an additional etching process for forming the first through hole 51 and the second through hole 56 may not be necessary.

Referring to FIG. 14, the pixel defining layer 190, the organic light emitting layer 210, and the second electrode 220 may be formed on the planarization layer 170.

The pixel defining layer 190 covering the first electrode 182 and the wiring 187 may be formed on the planarization layer 170. The pixel defining layer 190 may be formed to cover the peripheral portion 40 of the first electrode 181 and expose the emission portion 30 of the first electrode 181, and to entirely cover the wiring 187.

Hereinafter, an organic light emitting display device according to an embodiment will be explained with reference to FIGS. 15 and 16.

Figure 15:
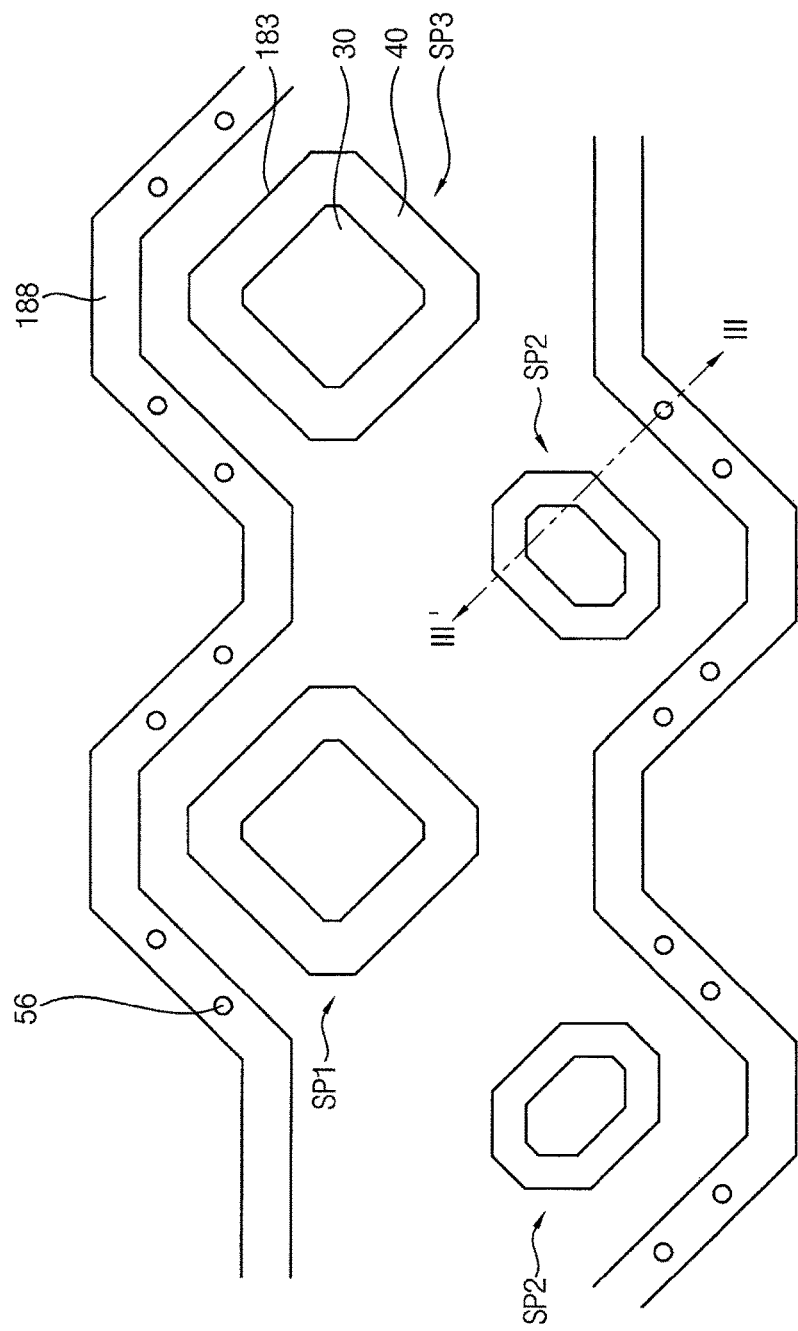
FIG. 15 is a plan view illustrating a display region of an organic light emitting display device according to an embodiment.

FIG. 15 is a plan view illustrating a display region of an organic light emitting display device according to an embodiment. FIG. 16 is a cross-sectional view illustrating the organic light emitting display device in FIG. 15 cut along a line III-III'.

Figure 16:
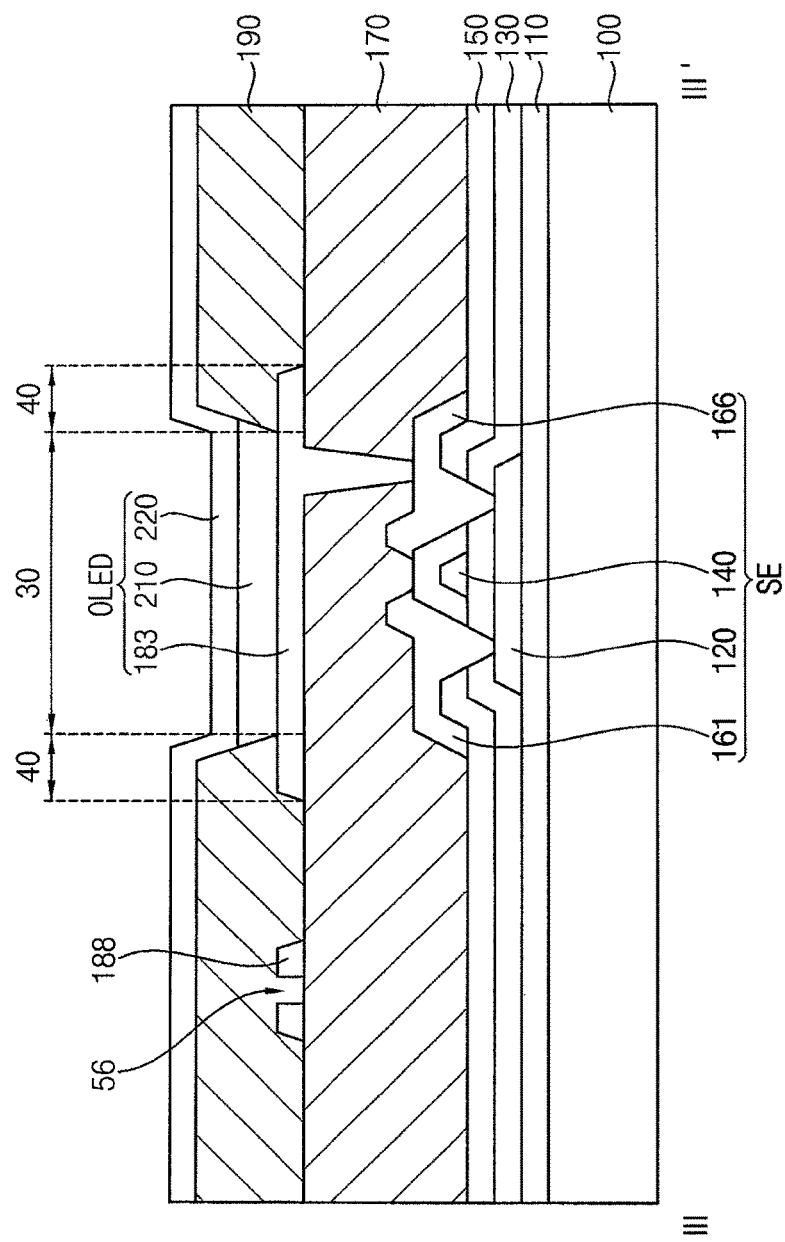
FIG. 16 is a cross-sectional view illustrating the organic light emitting display device in FIG. 15 cut along a line III-III'.

Referring to FIGS. 15 and 16, an organic light emitting display device according to an embodiment may include a switching element SE, a planarization layer 170, an organic light emitting diode OLED including a first electrode 183, a wiring 188, and a pixel defining layer 190. Detailed descriptions of elements of an organic light emitting display device explained with reference to FIGS. 15 and 16, which are substantially the same as or similar to those of the organic light emitting display device explained with reference to FIGS. 11 and 12, may not be repeated here.

The first electrode 183 may be disposed on the planarization layer 170. The first electrode 183 may include an emission portion 30 and a peripheral portion 40.

Unlike the first electrode 182 illustrated in FIGS. 11 and 12, a through hole may not be formed in the peripheral portion 40 of the first electrode 183 of the organic light emitting display device according to the embodiment. When a resolution of the organic light emitting display device increases, the area of the first electrode 183 may decrease, accordingly, a space for forming a through hole in the peripheral portion 40 of the first electrode 183 may not be enough.

The wiring 188 may be disposed on the planarization layer 170. The wiring 188 may be spaced apart from the first electrode 183. In an embodiment, the wiring 188 may be a power wiring transmitting a driving voltage to the switching element SE.

A through hole 56 may be defined in the wiring 188. The through hole 56 may pass through the wiring 188 in a thickness direction, and may expose an upper portion of the planarization layer 170.

In comparison with the organic light emitting display device according to an embodiment described with reference to FIGS. 2 and 3, the organic light emitting display device according to an embodiment described with reference to FIGS. 15 and 16 may include the through hole 56 defined in the wiring 187 instead of a through hole defined in the first electrode 183. Accordingly, a gas generated from the planarization layer 170 and/or the pixel defining layer 190 inside the display region 10 may be discharged enough.

The organic light emitting display device according to embodiments of the present disclosure may be applied to a display device included in a computer, a notebook, a mobile phone, a smartphone, a smart pad, a PMP, a PDA, an MP3 player, or the like.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, acts, operations, elements, and/or components, but do not preclude the presence or addition of one or more other features, integers, acts, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the terms "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Although the organic light emitting display devices and the method of manufacturing the organic light emitting display devices according to the embodiments of the present disclosure have been described with reference to the drawings, the illustrated embodiments are examples, and may be modified and changed by a person having ordinary knowledge in the relevant technical field without departing from the technical spirit of the present disclosure described in the following claims, and equivalents thereof.

What is claimed is:

1. An organic light emitting display device, comprising:
   a switching element disposed on a substrate;
   a planarization layer covering the switching element;
   a first electrode disposed on the planarization layer and coupled to the switching element, a first through hole being defined in a peripheral portion of the first electrode;
   a pixel defining layer covering the peripheral portion of the first electrode to expose an emission portion of the first electrode;
   an organic light emitting layer disposed on the emission portion of the first electrode; and
   a second electrode disposed on the organic light emitting layer.

2. The organic light emitting display device of claim 1, further comprising a plurality of first through holes.

3. The organic light emitting display device of claim 2, wherein the plurality of first through holes are disposed along the peripheral portion of the first electrode to surround the emission portion of the first electrode.

4. The organic light emitting display device of claim 1, wherein the first through hole has a circular shape in a plan view.

5. The organic light emitting display device of claim 4, wherein a diameter of the first through hole is less than a width of the peripheral portion of the first electrode.

6. The organic light emitting display device of claim 1, further comprising a wiring disposed on the planarization layer and spaced apart from the first electrode, a second through hole being defined in the wiring.

7. The organic light emitting display device of claim 6, wherein the second through hole has a circular shape in a plan view.

8. The organic light emitting display device of claim 7, wherein a diameter of the second through hole is less than a width of the wiring.

9. The organic light emitting display device of claim 6, wherein the wiring transmits a driving voltage to the switching element.

10. The organic light emitting display device of claim 1, wherein the planarization layer includes a siloxane-based organic material.

11. An organic light emitting display device, comprising:
    a switching element disposed on a substrate;
    a planarization layer covering the switching element;
    a first electrode disposed on the planarization layer and coupled to the switching element;
    a wiring disposed on the planarization layer and spaced apart from the first electrode, a through hole being defined in the wiring;
    a pixel defining layer covering the peripheral portion of the first electrode to expose an emission portion of the first electrode and covering the wiring;
    an organic light emitting layer disposed on the emission portion of the first electrode; and
    a second electrode disposed on the organic light emitting layer.

12. The organic light emitting display device of claim 11, further comprising a plurality of through holes.

13. The organic light emitting display device of claim 12, wherein the plurality of through holes are disposed along a direction in which the wiring is extended.

14. The organic light emitting display device of claim 11, wherein the through hole has a circular shape in a plan view.

15. The organic light emitting display device of claim 14, wherein a diameter of the through hole is less than a width of the wiring.

16. The organic light emitting display device of claim 11, wherein the wiring transmits a driving voltage to the switching element.

* * * * *